United States Patent
Lin et al.

(10) Patent No.: US 12,021,171 B2
(45) Date of Patent: Jun. 25, 2024

(54) MICRO LIGHT EMITTING DIODE AND DISPLAY PANEL HAVING ETCH PROTECTION CONDUCTIVE LAYER

(71) Applicant: PlayNitride Display Co., Ltd., MiaoLi County (TW)

(72) Inventors: Tzu-Yang Lin, MiaoLi County (TW); Yen-Chun Tseng, MiaoLi County (TW); Yun-Syuan Chou, MiaoLi County (TW); Fei-Hong Chen, MiaoLi County (TW); Pai-Yang Tsai, MiaoLi County (TW); Jian-Zhi Chen, MiaoLi County (TW)

(73) Assignee: PlayNitride Display Co., Ltd., MiaoLi County (TW)

(*) Notice: Subject to any disclaimer, the term of this patent is extended or adjusted under 35 U.S.C. 154(b) by 297 days.

(21) Appl. No.: 17/211,845

(22) Filed: Mar. 25, 2021

(65) Prior Publication Data
US 2022/0246798 A1 Aug. 4, 2022

(30) Foreign Application Priority Data
Jan. 29, 2021 (TW) ................. 110103382

(51) Int. Cl.
*H01L 33/38* (2010.01)
*H01L 27/15* (2006.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC ...... H01L 33/382; H01L 27/156; H01L 33/62
See application file for complete search history.

(56) References Cited

U.S. PATENT DOCUMENTS 5,998,805 A * 12/1999 Shi ................ H10K 50/171
257/97
9,368,683 B1 * 6/2016 Meitl ................ H01L 33/62
(Continued)

FOREIGN PATENT DOCUMENTS

| CN | 109244204 | 1/2019 |
| CN | 111524925 | 8/2020 |

(Continued)

OTHER PUBLICATIONS

"Office Action of China Counterpart Application", dated Dec. 12, 2022, p. 1-p. 7.

(Continued)

*Primary Examiner* — Thao X Le
*Assistant Examiner* — Sean Ayers Winters
(74) *Attorney, Agent, or Firm* — JCIPRNET

(57) ABSTRACT

A micro light emitting diode including an epitaxy layer, a first pad, a second pad, a first ohmic contact metal, a second ohmic contact metal and at least one etch protection conductive layer is provided. The first pad and the second pad are electrically connected to a first type semiconductor layer and a second type semiconductor layer of the epitaxy layer, respectively. The first ohmic contact metal is disposed between the first type semiconductor layer and the first pad. The second ohmic contact metal is disposed between the second type semiconductor layer and the second pad. The at least one etch protection conductive layer is disposed between the first ohmic contact metal and the first pad and/or between the second ohmic contact metal and the second pad. A display panel is also provided.

12 Claims, 12 Drawing Sheets

(56) References Cited

U.S. PATENT DOCUMENTS

| | | | |
|---|---|---|---|
| 9,583,466 B2 | 2/2017 | McGroddy et al. | |
| 9,673,366 B2* | 6/2017 | Hwang | H01L 33/06 |
| 10,217,403 B2 | 2/2019 | Lin et al. | |
| 10,763,389 B1 | 9/2020 | Thompson | |
| 2004/0147094 A1* | 7/2004 | Haberern | H01S 5/2231 |
| | | | 438/478 |
| 2005/0104080 A1* | 5/2005 | Ichihara | H01L 33/42 |
| | | | 257/E33.068 |
| 2005/0202587 A1* | 9/2005 | Redecker | H01L 29/423 |
| | | | 977/773 |
| 2006/0180819 A1* | 8/2006 | Kim | H01L 33/405 |
| | | | 257/E33.068 |
| 2008/0142810 A1* | 6/2008 | Tompa | G02B 6/1225 |
| | | | 257/E33.025 |
| 2009/0208731 A1* | 8/2009 | Saimen | H05K 3/323 |
| | | | 428/327 |
| 2011/0049572 A1* | 3/2011 | Jeon | H01L 29/66212 |
| | | | 257/E29.091 |
| 2011/0057231 A1* | 3/2011 | Jeon | H01L 29/0692 |
| | | | 257/E21.09 |
| 2011/0057234 A1* | 3/2011 | Jeon | H01L 29/66007 |
| | | | 257/E21.403 |
| 2013/0056757 A1* | 3/2013 | Miyachi | H01L 27/153 |
| | | | 257/E33.071 |
| 2014/0166349 A1* | 6/2014 | Otsuka | C23C 28/021 |
| | | | 216/13 |
| 2016/0268165 A1* | 9/2016 | Matsui | H01L 21/3081 |
| 2016/0336484 A1 | 11/2016 | McGroddy et al. | |
| 2016/0343772 A1 | 11/2016 | Bower et al. | |
| 2018/0269635 A1* | 9/2018 | Uchino | H01R 13/03 |
| 2018/0301576 A1* | 10/2018 | Park | H01L 31/0304 |
| 2019/0237630 A1* | 8/2019 | Check | H01L 33/46 |
| 2020/0104550 A1* | 4/2020 | Russell-Clarke | |
| | | | G06K 19/07722 |
| 2020/0220046 A1* | 7/2020 | Inazu | H01L 33/32 |
| 2020/0395506 A1* | 12/2020 | Inazu | H01L 33/405 |

FOREIGN PATENT DOCUMENTS

| | | |
|---|---|---|
| CN | 211604646 | 9/2020 |
| EP | 2816619 | 12/2014 |
| JP | 2007080899 | 3/2007 |
| JP | 2015070079 | 4/2015 |
| JP | 2018032798 | 3/2018 |

OTHER PUBLICATIONS

"Notice of allowance of China Counterpart Application", dated Aug. 1, 2023, p. 1-p. 3.

"Office Action of Taiwan Counterpart Application", dated Sep. 10, 2021, p. 1-p. 3.

* cited by examiner

MICRO LIGHT EMITTING DIODE AND DISPLAY PANEL HAVING ETCH PROTECTION CONDUCTIVE LAYER

CROSS-REFERENCE TO RELATED APPLICATION

This application claims the priority benefit of Taiwan application serial no. 110103382, filed on Jan. 29, 2021. The entirety of the above-mentioned patent application is hereby incorporated by reference herein and made a part of this specification.

BACKGROUND

Technical Field

The disclosure relates to a light emitting device and a display panel including the light emitting device, and particularly relates to a micro light emitting diode and a display panel including the micro light emitting diode.

Description of Related Art

The light emitting efficiency of a micro light emitting diode (micro LED) chip is related to the internal quantum efficiency and the external light extraction efficiency thereof. The internal quantum efficiency of the micro LED chip is related to the epitaxy quality and the electrode design thereof, and the external light extraction efficiency of the micro LED chip is related to the substrate design (e.g., a patterned substrate, a roughened substrate, etc.) thereof and the optical device design (e.g., a light emitting surface structure, a reflector, a lens element, etc.) outside the chip. Taking the electrode design of the micro LED chip as an example, if the electrode is damaged during the manufacturing process, such damage may reduce the light emitting efficiency (i.e., the internal quantum efficiency) of the micro LED chip. Therefore, the electrode design of a micro LED chip has certainly become an issue to work on.

SUMMARY

The invention provides a micro light emitting diode (LED) and a display panel having the micro LED. An LED chip is provided with an etch protection conductive layer disposed between a pixel electrode and an ohmic contact metal.

According to an embodiment of the disclosure, a micro light emitting diode (LED) is provided. The micro LED includes an epitaxy layer, a first pad, a second pad, a first ohmic contact metal, a second ohmic contact metal and at least one etch protection conductive layer. The epitaxy layer includes a first type semiconductor layer, a second type semiconductor layer, and an active layer. The active layer is disposed between the first type semiconductor layer and the second type semiconductor layer. The first pad and the second pad are respectively electrically connected to the first type semiconductor layer and the second type semiconductor layer. The first ohmic contact metal is disposed between the first type semiconductor layer and the first pad. The second ohmic contact metal is disposed between the second type semiconductor layer and the second pad. The at least one etch protection conductive layer is disposed between the first ohmic contact metal and the first pad and/or between the second ohmic contact metal and the second pad.

Another embodiment of the disclosure provides a display panel. The display panel includes a plurality of pixel units arranged in an array. Each of the pixel units includes the micro LED.

Based on the above, the micro LED according to the embodiments of the disclosure is provided with the etch protection conductive layer disposed between the pixel electrode and the ohmic contact metal. Since the etch protection conductive layer serves as the etching-protective layer of the ohmic contact metal, the electrode of the micro LED is not damaged during the manufacturing process to reduce the contact resistance. Therefore, the light emitting efficiency is high. In addition, the display panel according to the embodiments of the disclosure includes the micro LED having a low contact resistance and high light emitting efficiency.

To make the above features and advantages of the invention more comprehensible, embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
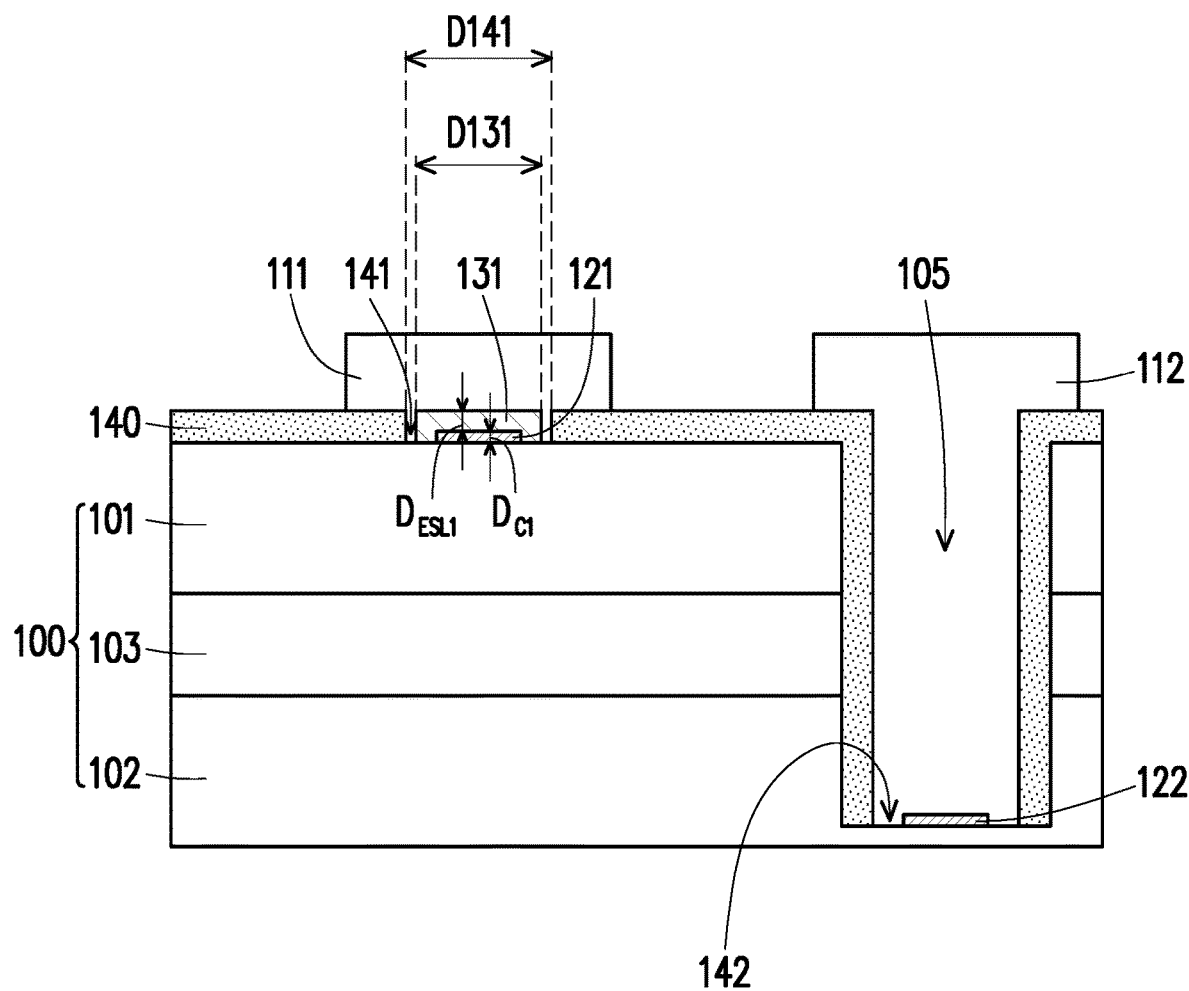
FIG. 1A illustrates a micro light emitting diode (LED) according to a first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Referring to FIG. 1A, FIG. 1A illustrates a micro light emitting diode (LED) according to a first embodiment of the disclosure. A micro LED 1 includes an epitaxy layer 100, a first pad 111, a second pad 112, a first ohmic contact metal 121, a second ohmic contact metal 122, a first etch protection conductive layer 131, and a dielectric layer 140. The epitaxy layer 100 includes a first type semiconductor layer 101, a second type semiconductor layer 102, and an active layer 103. The active layer 103 is disposed between the first type semiconductor layer 101 and the second type semiconductor layer 102. The first pad 111 and the second pad 112 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111, and serves as an ohmic contact of the first type semiconductor layer 101. The second ohmic contact metal 122 is disposed between the second type semiconductor layer 102 and the second pad 112. The first etch protection conductive layer 131 is disposed between the first ohmic contact metal 121 and the first pad 111 and serves as an ohmic contact of the second type semiconductor layer 102.

In the embodiment, the micro LED 1 is a flip-chip type micro LED. The first pad 111 and the second pad 112 are disposed on the same side of the epitaxy layer 100. In addition, an opening 105 in which the second pad 112 is disposed may be formed by, for example, performing an etching process on the epitaxy layer 100. According to an embodiment of the disclosure, the first type semiconductor layer 101 and the second type semiconductor layer 102 may respectively be an n-type semiconductor layer and a p-type semiconductor layer. However, the disclosure is not limited thereto. According to another embodiment of the disclosure, the first-type semiconductor layer 101 and the second-type semiconductor layer 102 are respectively a p-type semiconductor layer and an n-type semiconductor layer. The active layer 103 is a quantum well light emitting layer.

The dielectric layer 140 may be formed by, for example, performing a sputtering process or a chemical vapor deposition (CVD) process, etc., and the dielectric layer 140 serves to protect a surface of the chip. When the dielectric layer 140 is formed by stacked dielectric layers with high and low refractive indices through evaporation, for example, the dielectric layer 140 may also serve as a distributed Bragg reflector (DBR) to increase the reflectivity of light emitted by the micro LED 1.

In the embodiment, the dielectric layer 140, the first pad 111, and the second pad 112 are disposed on the same side of the epitaxy layer 100 (i.e., opposite to the light emission by the micro LED 1), the first etch protection conductive layer 131 and the first ohmic contact metal 121 are disposed in a first through hole 141 of the dielectric layer 140, and the second ohmic contact metal 122 is disposed in a second through hole 142 of the dielectric layer 140. It should be noted that the dielectric layer 140 may also be disposed on a least a portion of a side surface on a periphery of the epitaxy layer 100 to offer more comprehensive protection. However, the disclosure is not limited thereto.

In the manufacturing process, an evaporation process and a thermal annealing process may be performed to form the first ohmic contact metal 121 and the second ohmic contact metal 122, and then an evaporation process may be performed to form the first etch protection conductive layer 131. Then, by evaporating the dielectric layer 140 through a sputtering process or a CVD process and forming holes on the dielectric layer 140 through a dry etching process, the first through hole 141 and the second through hole 142 are formed. In the process of forming a hole on the dielectric layer 140 to form the first through hole 141, since the first etch protection conductive layer 131 covers the first ohmic contact metal 121, the surface of the first ohmic contact metal 121 is prevented from being damaged by etchant gas and preserves the property of having a low contact resistance. Therefore, the micro LED 1 exhibits high light emitting efficiency. In other words, the first etch protection conductive layer 131 serves as an etching-protective layer of the first ohmic contact metal 121. From another perspective, the first etch protection conductive layer 131 serves as an etching stop layer of the first ohmic contact metal 121. The influence of the etchant gas stops at the first etch protection conductive layer 131 and does not influence the first ohmic contact metal 121.

Figure 1B:
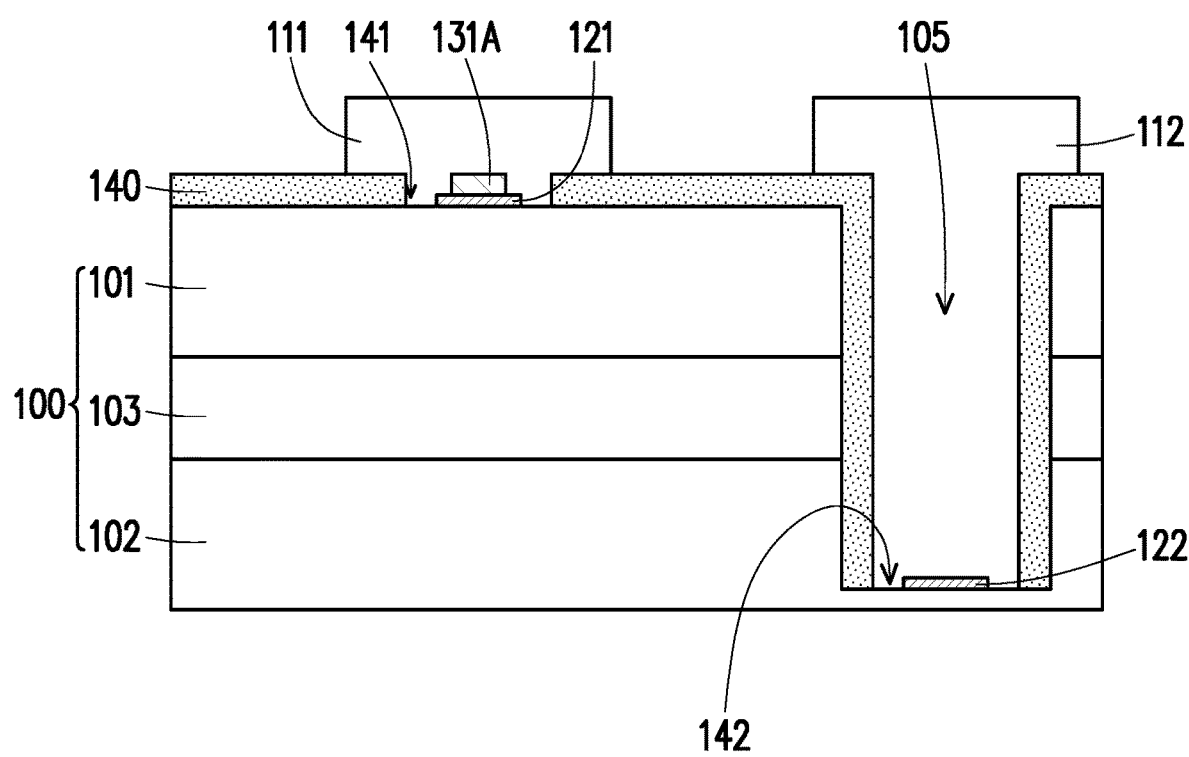
FIG. 1B illustrates a micro LED according to an embodiment of the disclosure.

In the embodiment, the first ohmic contact metal 121 and the first etch protection conductive layer 131 are disposed in the first through hole 141. In addition, a width D131 of an orthogonal projection of the first etch protection conductive layer 131 on the first type semiconductor layer 101 is less than a width D141 of an orthogonal projection of the first through hole 141 on the first type semiconductor layer 101. The first etch protection conductive layer 131 is disposed between the first ohmic contact metal 121 and the first pad 111. In addition, a ratio of the area of the orthogonal projection of the first etch protection conductive layer 131 on the first type semiconductor layer 101 to the area of an orthogonal projection of the first ohmic contact metal 121 on the first type semiconductor layer 101 ranges from 1.0 to 1.2. Here, the first etch protection conductive layer 131 directly contacts and encapsulates the exposed surface of the first ohmic contact metal 121, and may comprehensively protect the first ohmic contact metal 121 so as not to be damaged by enchant ions while ensuring the conductivity between the first ohmic contact metal 121 and the first pad 111. Here, the first etch protection conductive layer 131 may also encapsulate the exposed side surface of the first ohmic contact metal 121, so that the exposed portion of the first ohmic contact metal 121 is completely protected, and better protection is achieved. Alternatively, in a micro LED 1A shown in FIG. 1B, a first etch protection conductive layer 131A directly contacts and is partially disposed on the first ohmic contact metal 121. As long as the first etch protection conductive layer 131A is disposed between the first ohmic contact metal 121 and the first pad 111, the first ohmic contact metal 121 may be protected in the etching process from being directly damaged by etchant ions. The first etch protection conductive layer 131A is disposed between the first ohmic contact metal 121 and the first pad 111. In addition, a ratio of the area of an orthogonal projection of the first etch protection conductive layer 131A on the first type semiconductor layer 101 to the area of an orthogonal projection of the first ohmic contact metal 121 on the first type semiconductor layer 101 ranges from 0.8 to 1. If the ratio is excessively high, the ohmic contact of the first ohmic contact metal 121 with respect to the first type semiconductor layer 101 is insufficient. If the ratio is excessively low, the protection of the first etch protection conductive layer 131A to the first ohmic contact metal 121 is insufficient.

Referring to FIG. 1A again, in the embodiment, the material of the first etch protection conductive layer 131 may include a metal conductive material or a non-metal conductive material. The non-metal conductive material, for example, may be graphene, diamond-like carbon, or a transparent conductive layer (e.g., ITO or IZO), etc. Meanwhile, if the first etch protection conductive layer 131 includes a metal conductive material, the reflection of the emitted light may be enhanced. The resistivity of the first etch protection conductive layer 131 is greater than the resistivities of the first pad 111 and the first ohmic contact metal 121, and is less than $5 \times 10^{-4}$ $\Omega \cdot cm$, to prevent the ohmic contact efficiency of the micro LED 1 from being affected.

In addition, in order to provide comprehensive protection to the first ohmic contact metal 121 and prevent the ohmic contact resistance of the micro LED 1 from being excessively high, the thickness of the first etch protection conductive layer 131 should be controlled within a suitable range. In the embodiment, the micro LED 1 meets the condition $D_{C1} < D_{ESL1} \leq 5 \times D_{C1}$, wherein $D_{ESL1}$ represents the thickness of the first etch protection conductive layer 131 in the normal direction of the first type semiconductor layer 101, and $D_{C1}$ represents the thickness of the first ohmic contact metal 121 in the normal direction of the first type semiconductor layer 101. If the thickness is excessively small, the first ohmic contact metal 121 cannot be protected, and if the thickness is excessively large, the ohmic contact of the first ohmic contact metal 121 is not favorable. It should be noted that the total of $D_{ESL1}$ and $D_{C1}$ is greater than or equal to the thickness of the dielectric layer 140. In addition, the thickness of $D_{C1}$ is less than the thickness of the dielectric layer 140. Accordingly, the first ohmic contact metal 121 may be protected during the manufacturing process.

To sufficiently describe various examples and aspects of the disclosure, several other embodiments of the disclosure will be described in the following. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2A:
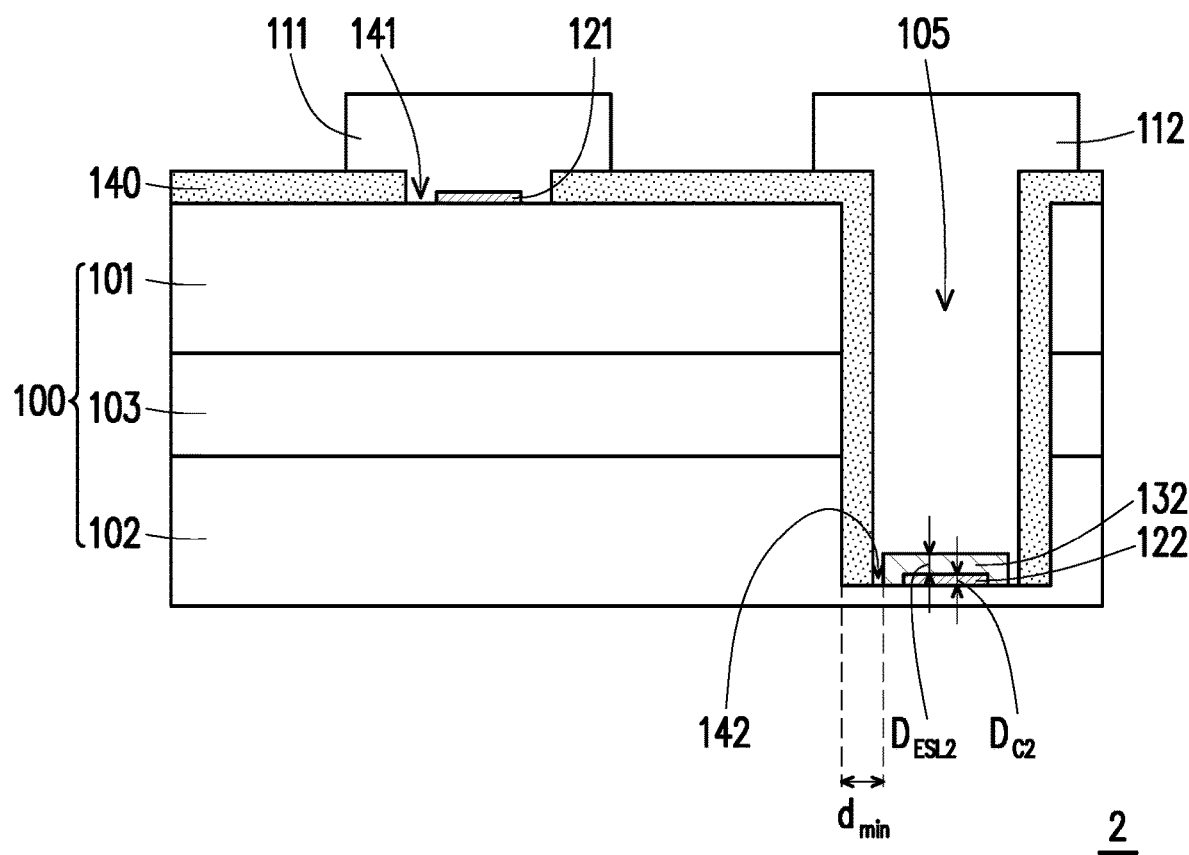
FIG. 2A illustrates a micro LED according to a second embodiment of the disclosure.

Referring to FIG. 2A, FIG. 2A illustrates a micro LED according to a second embodiment of the disclosure. A micro LED 2 includes the epitaxy layer 100, the first pad 111, the second pad 112, the first ohmic contact metal 121, the second ohmic contact metal 122, a second etch protection conductive layer 132, and the dielectric layer 140. The epitaxy layer 100 includes the first type semiconductor layer 101, the second type semiconductor layer 102, and the active layer 103. The active layer 103 is disposed between the first type semiconductor layer 101 and the second type semiconductor layer 102. The first pad 111 and the second pad 112 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111. The second ohmic contact metal 122 is disposed between the second type semiconductor layer 102 and the second pad 112. The second etch protection conductive layer 132 is disposed between the second ohmic contact metal 122 and the second pad 112. In addition, the first ohmic contact metal 121 is disposed in the first through hole 141 of the dielectric layer 140, and the second ohmic contact metal 122 and the second etch protection conductive layer 132 are disposed in the second through hole 142 of the dielectric layer 140.

In the manufacturing process, an evaporation process and a thermal annealing process may be performed to form the first ohmic contact metal 121 and the second ohmic contact metal 122, and then an evaporation process is performed to form the second etch protection conductive layer 132. Then, by evaporating the dielectric layer 140 through a sputtering process or a CVD process and forming holes on the dielectric layer 140 through a dry etching process, the first through hole 141 and the second through hole 142 are formed. In the process of forming a hole on the dielectric layer 140 to form the second through hole 142, since the second etch protection conductive layer 132 covers the second ohmic contact metal 122, the surface of the second ohmic contact metal 122 is prevented from being damaged by etchant gas and preserves the property of having a low contact resistance. Therefore, the micro LED 2 exhibits high light emitting efficiency. In other words, the second etch protection conductive layer 132 serves as an etching-protective layer of the second ohmic contact metal 122. From another perspective, the second etch protection conductive layer 132 serves as an etching stop layer of the second ohmic contact metal 122. The influence of the etchant gas stops at the second etch protection conductive layer 132 and does not influence the second ohmic contact metal 122.

In the embodiment, the material of the second etch protection conductive layer 132 may be a metal conductive material or a non-metal conductive material. The non-metal conductive material, for example, may be graphene, diamond-like carbon, or a transparent conductive layer, etc. The resistivity of the second etch protection conductive layer 132 is greater than the resistivities of the second pad 112 and the second ohmic contact metal 122, and is less than $5 \times 10^{-4}$ Ω·cm to prevent the ohmic contact efficiency of the micro LED 2 from being affected.

In addition, in order to provide comprehensive protection to the second ohmic contact metal 122 and prevent the ohmic contact resistance of the micro LED 2 from being excessively high, the thickness of the second etch protection conductive layer 132 should be controlled within a suitable range. In the embodiment, the micro LED 2 meets the condition $D_{C2} < D_{ESL2} \leq 5 \times D_{C2}$, wherein $D_{ESL2}$ represents the thickness of the second etch protection conductive layer 132 in the normal direction of the first type semiconductor layer 101, and $D_{C2}$ represents the thickness of the second ohmic contact metal 122 in the normal direction of the first type semiconductor layer 101.

Figure 2B:
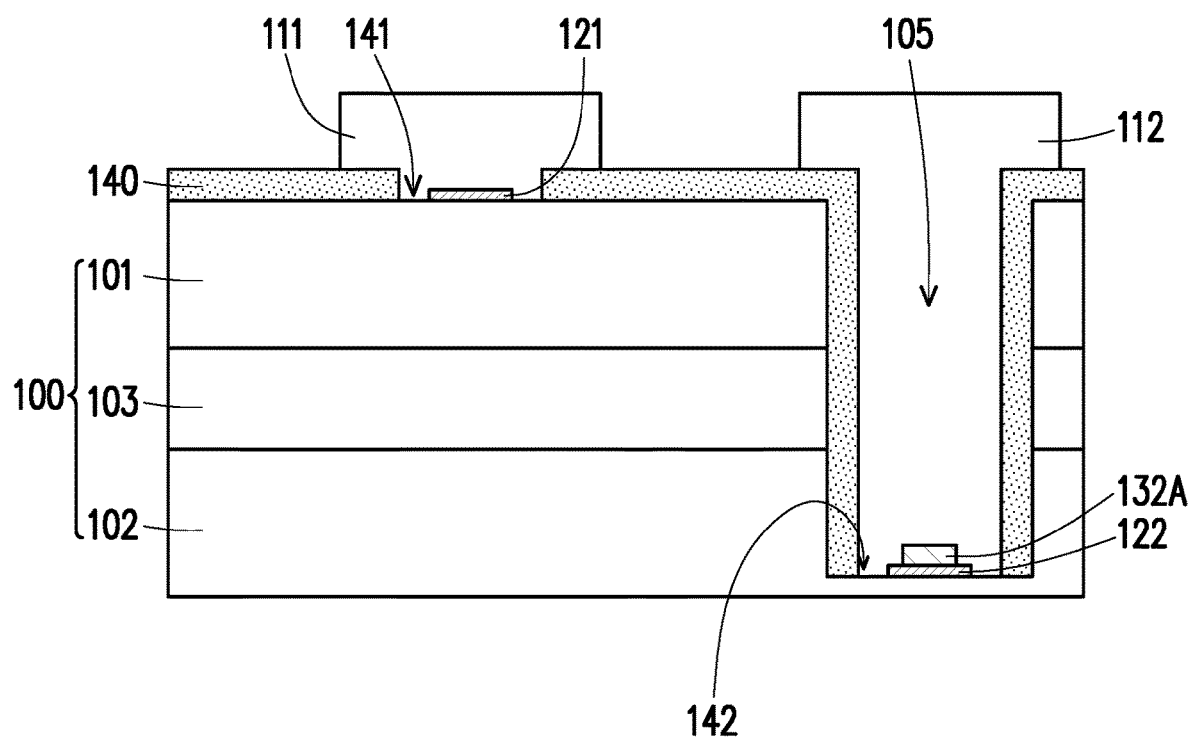
FIG. 2B illustrates a micro LED according to an embodiment of the disclosure.

In the embodiment, the second etch protection conductive layer 132 is disposed between the second ohmic contact metal 122 and the second pad 112. A minimum interval $d_{min}$ is provided between the second etch protection conductive layer 132 and the opening 105 of the epitaxy layer 100. In addition, the minimum interval $d_{min}$ is greater than or equal to 300 nm. If the interval is excessively small, the manufacturing yield for subsequently disposing the dielectric layer 140 may be affected. Here, the second etch protection conductive layer 132 directly contacts and encapsulates the exposed surface of the second ohmic contact metal 122, and is able to comprehensively protect the second ohmic contact metal 122 so as not to be damaged by enchant ions while ensuring the conductivity between the second ohmic contact metal 122 and the second pad 112. The second etch protection conductive layer 132 is disposed between the second ohmic contact metal 122 and the second pad 112. In addition, a ratio of the area of an orthogonal projection of the second etch protection conductive layer 132 on the second type semiconductor layer 102 to the area of an orthogonal projection of the second ohmic contact metal 122 on the second type semiconductor layer 102 ranges from 1 to 1.2. The second etch protection conductive layer 132 further encapsulates the exposed side surface of the second ohmic contact metal 122, so that better protection is achieved. Alternatively, in a micro LED 2A shown in FIG. 2B, a second etch protection conductive layer 132A directly contacts and is partially disposed on the second ohmic contact metal 122. As long as the second etch protection conductive layer 132 is disposed between the second ohmic contact metal 122 and the second pad 112, the second ohmic contact metal 122 may be protected in the etching process from being directly damaged by etchant ions. The second etch protection conductive layer 132A is disposed between the second ohmic contact metal 122 and the second pad 112. In addition, a ratio of the area of an orthogonal projection of the second etch protection conductive layer 132A on the second type semiconductor layer 102 to the area of the orthogonal projection of the second ohmic contact metal 122 on the second type semiconductor layer 102 ranges from 0.8 to 1. If the ratio is excessively high, the ohmic contact of the second ohmic contact metal 122 with the second type semiconductor layer 102 is insufficient. If the ratio is excessively low, the protection of the second etch protection conductive layer 132A to the second ohmic contact metal 122 is insufficient.

Figure 3A:
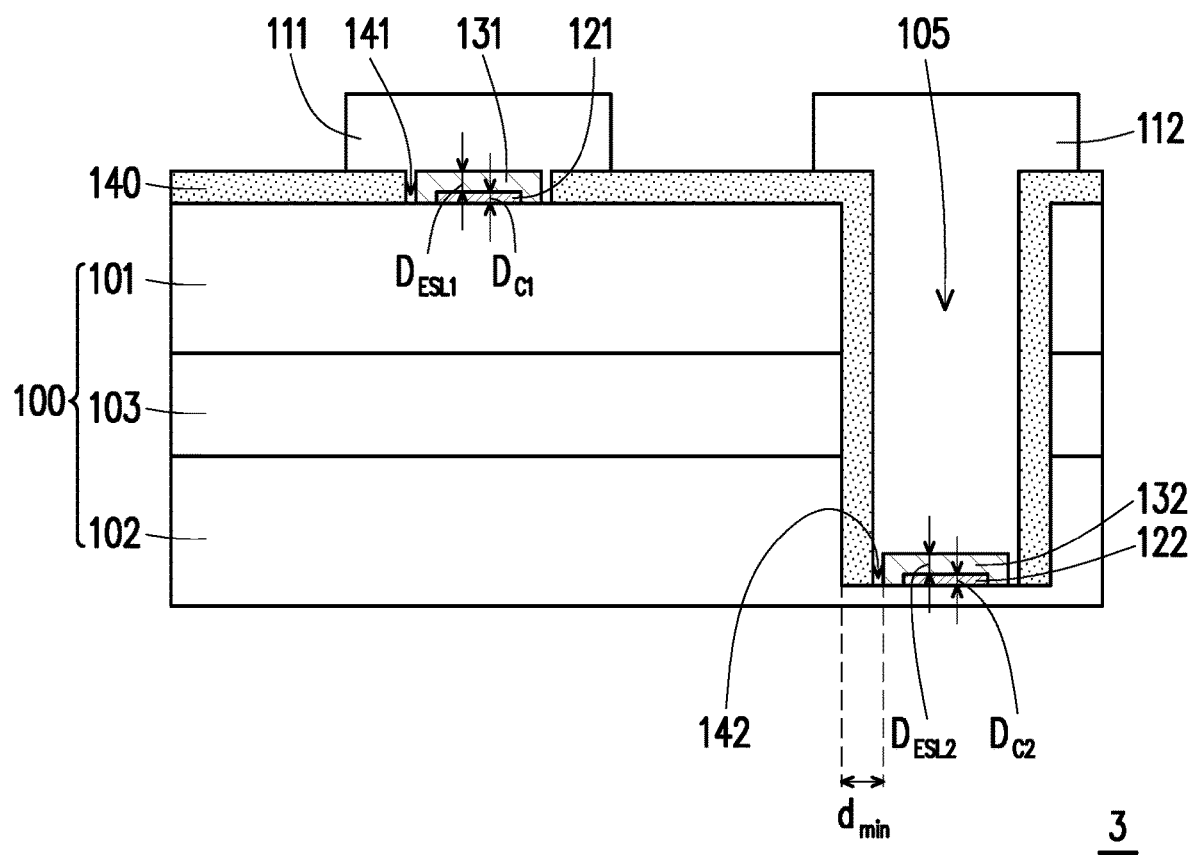
FIG. 3A illustrates a micro LED according to a third embodiment of the disclosure.

Referring to FIG. 3A, FIG. 3A illustrates a micro LED according to a third embodiment of the disclosure. A micro LED 3 includes the epitaxy layer 100, the first pad 111, the second pad 112, the first ohmic contact metal 121, the second ohmic contact metal 122, the first etch protection conductive layer 131, the second etch protection conductive layer 132, and the dielectric layer 140. The epitaxy layer 100 includes the first type semiconductor layer 101, the second type semiconductor layer 102, and the active layer 103. The active layer 103 is disposed between the first type semiconductor layer 101 and the second type semiconductor layer 102. The first pad 111 and the second pad 112 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111. The second ohmic contact metal 122 is disposed between the second type semiconductor layer 102 and the second pad 112. The first etch protection conductive layer 131 is disposed between the first ohmic contact metal 121 and the first pad 111. The second etch protection conductive layer 132 is disposed between the second ohmic contact metal 122 and the second pad 112. In addition, the first ohmic contact metal 121 and the first etch protection conductive layer 131 are disposed in the first through hole 141 of the dielectric layer 140, and the second ohmic contact metal 122 and the second etch protection conductive layer 132 are disposed in the second through hole 142 of the dielectric layer 140.

In the manufacturing process, an evaporation process and a thermal annealing process may be performed to form the first ohmic contact metal 121 and the second ohmic contact metal 122, and then an evaporation process is performed to form the first etch protection conductive layer 131 and the second etch protection conductive layer 132. Then, by evaporating the dielectric layer 140 through a sputtering process or a CVD process and forming holes on the dielectric layer 140 through a dry etching process, the first through hole 141 and the second through hole 142 are formed. In the process of forming holes on the dielectric layer 140 to form the first through hole 141 and the second through hole 142, since the first etch protection conductive layer 131 covers the first ohmic contact metal 121, the surface of the first ohmic contact metal 121 is prevented from being damaged by etchant gas and preserves the property of having a low contact resistance. In other words, the first etch protection conductive layer 131 serves as an etching-protective layer of the first ohmic contact metal 121. Similarly, since the second etch protection conductive layer 132 covers the second ohmic contact metal 122, the surface of the second ohmic contact metal 122 is prevented from being damaged by etchant gas and preserves the property of having a low contact resistance. Therefore, the micro LED 3 exhibits high light emitting efficiency. In other words, the second etch protection conductive layer 132 serves as an etching-protective layer of the second ohmic contact metal 122.

In the embodiment, the area of the orthogonal projection of the first etch protection conductive layer 131 on the second type semiconductor layer 102 may be the same as or different from the area of the orthogonal projection of the second etch protection conductive layer 132 on the second type semiconductor layer 102. The first etch protection conductive layer 131 and the second etch protection conductive layer 132 may have the same or different shapes.

The materials of the first etch protection conductive layer 131 and the second etch protection conductive layer 132 may be the same or different materials. Specifically, the materials of the first etch protection conductive layer 131 and the second etch protection conductive layer 132 may be a metal conductive material or a non-metal conductive material. The non-metal conductive material, for example, may be graphene, diamond-like carbon, or a transparent conductive layer, etc. The resistivities of the first etch protection conductive layer 131 and the second etch protection conductive layer 132 are greater than the resistivities of the first pad 111, the second ohmic contact metal 121, the second pad 112, and the second ohmic contact metal 122, and are less than $5 \times 10^{-4}$ Ω·cm.

In addition, in order to provide comprehensive protection to the first ohmic contact metal 121 and the second ohmic contact metal 122 and prevent the ohmic contact resistance of the micro LED 3 from being excessively high, the thicknesses of the first etch protection conductive layer 131 and the second etch protection conductive layer 132 should be controlled within a suitable range. In the embodiment, the micro LED 3 meets the conditions $D_{C1} < D_{ESL1} \leq 5 \times D_{C1}$, $D_{C2} < D_{ESL2} \leq 5 \times D_{C2}$, wherein $D_{ESL1}$ represents the thickness of the first etch protection conductive layer 131 in the normal direction of the first type semiconductor layer 101, $D_{C1}$ represents the thickness of the first ohmic contact metal 121 in the normal direction of the first type semiconductor layer 101, $D_{ESL2}$ represents the thickness of the second etch protection conductive layer 132 in the normal direction of the first type semiconductor layer 101, and $D_{C2}$ represents the thickness of the second ohmic contact metal 122 in the normal direction of the first type semiconductor layer 101. In the embodiment, the thickness $D_{ESL1}$ of the first etch protection conductive layer 131 and the thickness $D_{ESL2}$ of the second etch protection conductive layer 132 meet the condition that $D_{ESL1}/D_{ESL2}$ ranges from 0.9 to 1.1. That is, the difference between the thickness $D_{ESL1}$ of the first etch protection conductive layer 131 and the thickness $D_{ESL2}$ of the second etch protection conductive layer 132 is less than 10% of the thickness $D_{ESL1}$ of the first etch protection conductive layer 131. With the thicknesses being close, the manufacturing process is simplified and the yield is increased. According to an embodiment of the disclosure, the thickness $D_{ESL1}$ of the first etch protection conductive layer 131 is equal to the thickness $D_{ESL2}$ of the second etch protection conductive layer 132.

In the embodiment, the second etch protection conductive layer 132 is disposed between the second ohmic contact metal 122 and the second pad 112. A minimum interval $d_{min}$ is provided between the second etch protection conductive layer 132 and the opening 105 of the epitaxy layer 100. In addition, the minimum interval $d_{min}$ is greater than or equal to 300 nm.

Figure 3B:
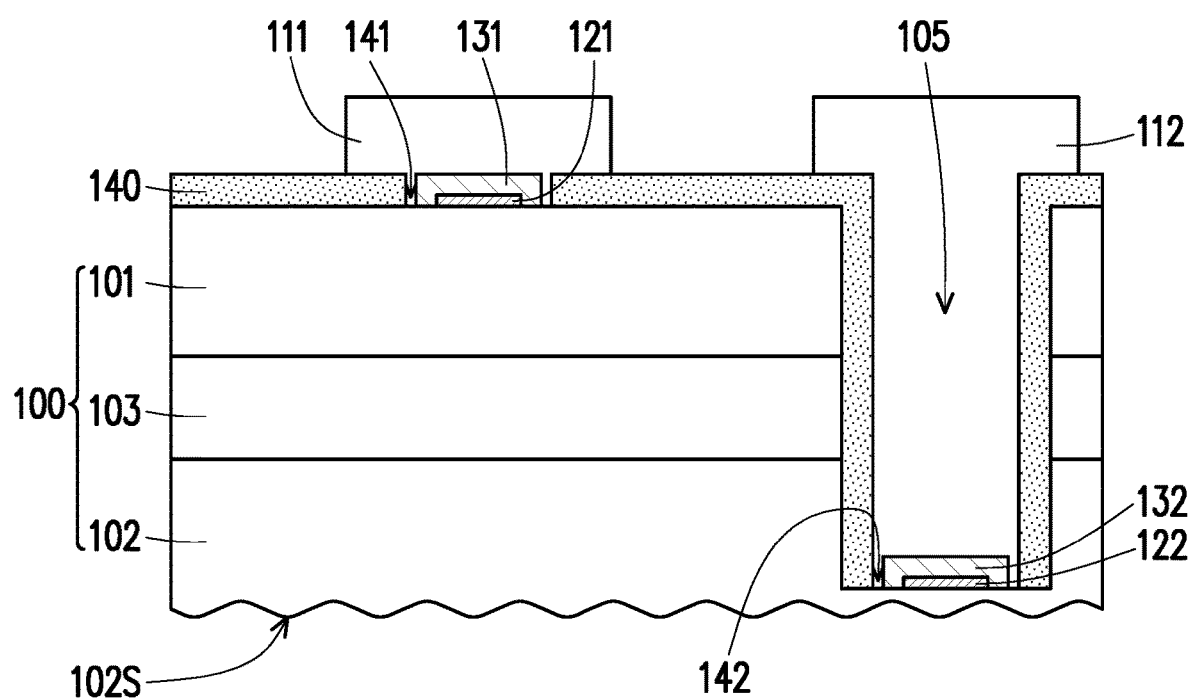
FIG. 3B illustrates a micro LED chip according to the third embodiment of the disclosure.

Referring to FIG. 3B, a micro LED chip 31 has a light emitting surface 102S. The light emitting surface 102S may have a periodic structure or a non-periodic, surface-roughened structure, so as to facilitate the light extraction efficiency of the micro LED chip 31.

Figure 4:
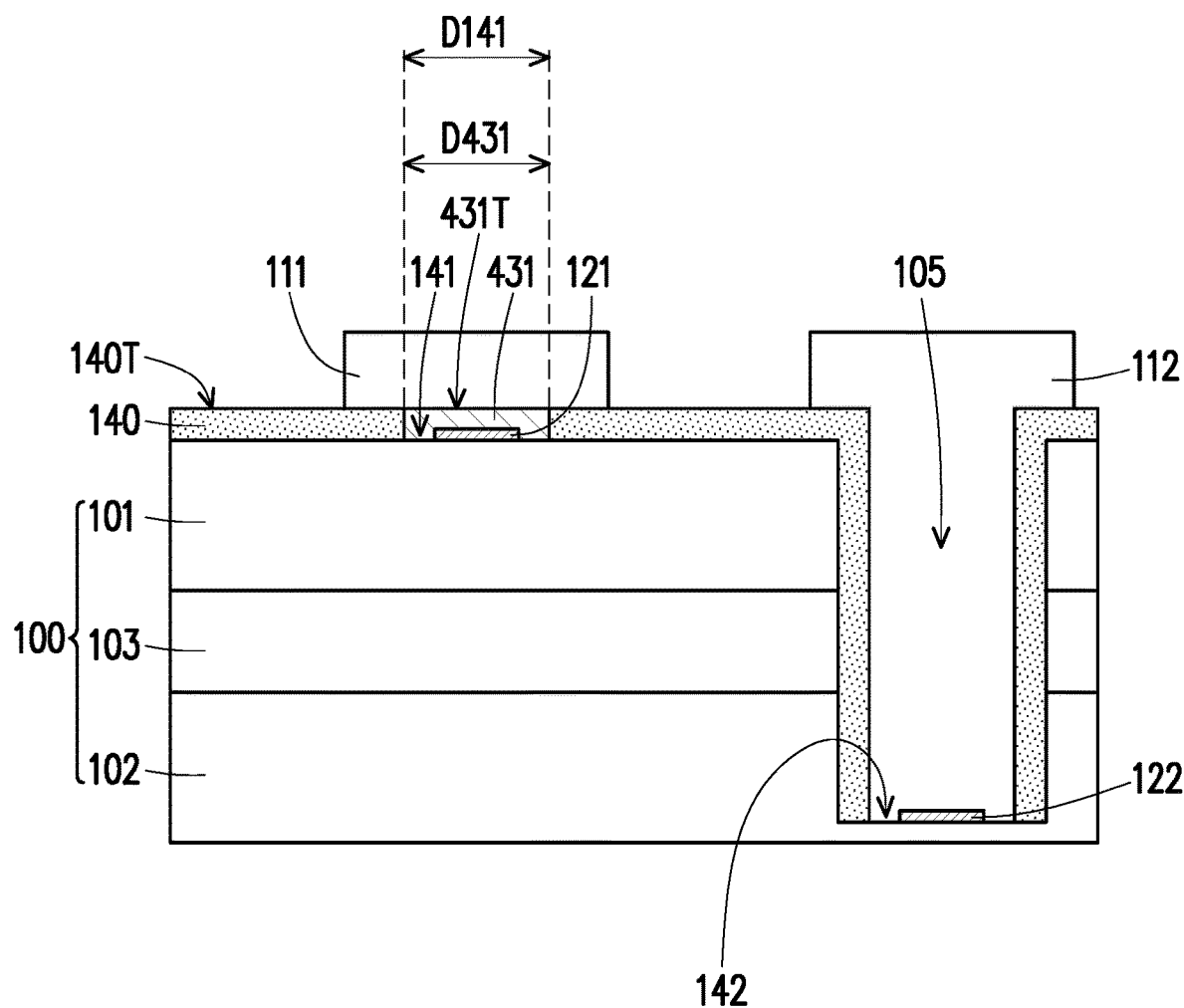
FIGS. 4 to 8 respectively illustrate micro LEDs according to fourth to eighth embodiments of the disclosure.

Referring to FIG. 4, FIG. 4 illustrates a micro LED according to a fourth embodiment of the disclosure. A micro LED 4 includes the epitaxy layer 100, the first pad 111, the second pad 112, the first ohmic contact metal 121, the second ohmic contact metal 122, a first etch protection conductive layer 431, and the dielectric layer 140. The epitaxy layer 100 includes the first type semiconductor layer 101, the second type semiconductor layer 102, and the active layer 103. The active layer 103 is disposed between the first type semiconductor layer 101 and the second type semiconductor layer 102. The first pad 111 and the second pad 112 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111. The second ohmic contact metal 122 is disposed between the second type semiconductor layer 102 and the second pad 112. The first etch protection conductive layer 431 is disposed between the first ohmic contact metal 121 and the first pad 111.

The micro LED 4 according to the embodiment differs from the micro LED 1 of the first embodiment in that, in the micro LED 1, the width D131 of the orthogonal projection of the first etch protection conductive layer 131 on the first type semiconductor layer 101 is less than the width D141 of the orthogonal projection of the first through hole 141 on the first type semiconductor layer 101, whereas in the micro LED 4, a width D431 of an orthogonal projection of a first etch protection conductive layer 431 on the first type semiconductor layer 101 is equal to the width D141 of the orthogonal projection of the first through hole 141 on the first type semiconductor layer 101. The first pad 111 does not contact the first type semiconductor layer 101. It should be noted that a top surface 431T of the first etch protection conductive layer 431 is aligned with a top surface 140T of the dielectric layer 140. By doing so, a flatter surface is provided when the first pad 111 is disposed thereon, and the yield may be further increased.

Except for the description about the width of the orthogonal projection of the first etch protection conductive layer 431 on the first type semiconductor layer 101, reference is made to the first embodiment for other details about the micro LED 4, and the same details will not be repeated in the following.

Figure 5:
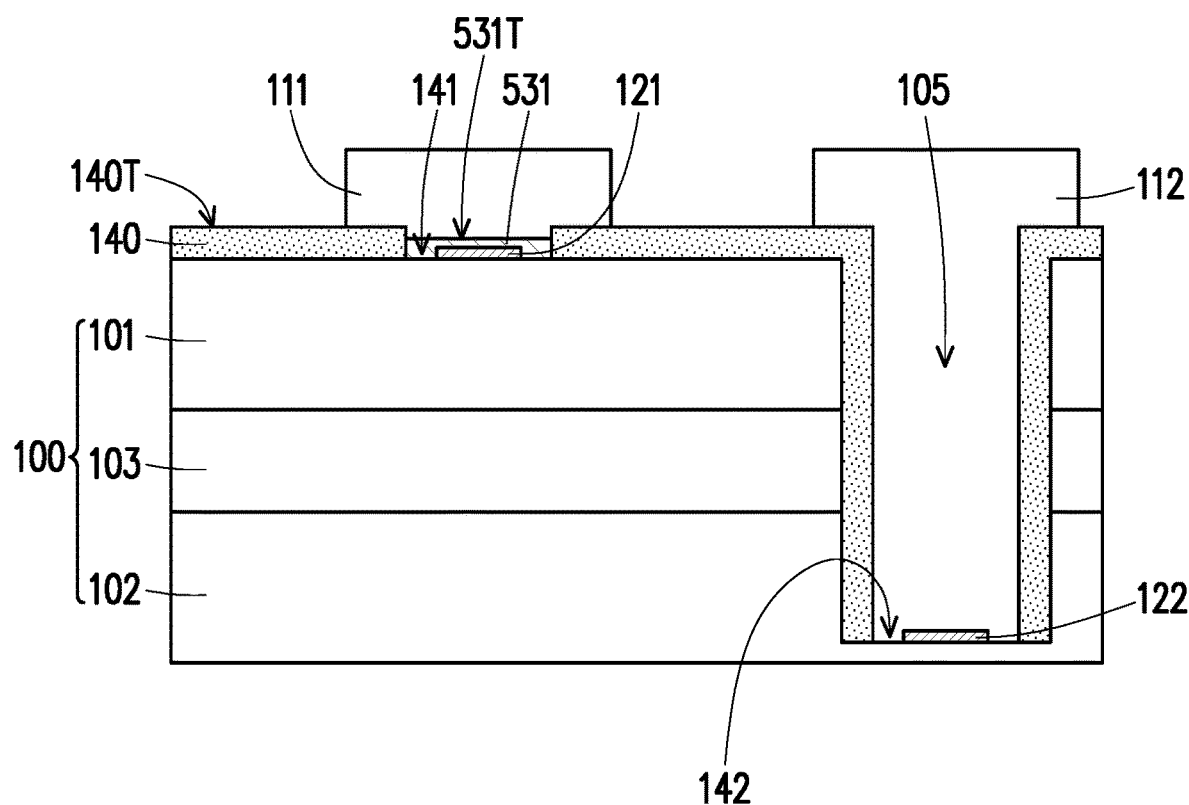

Referring to FIG. 5, FIG. 5 illustrates a micro LED according to a fifth embodiment of the disclosure. A micro LED 5 includes the epitaxy layer 100, the first pad 111, the second pad 112, the first ohmic contact metal 121, the second ohmic contact metal 122, a first etch protection conductive layer 531, and the dielectric layer 140. The epitaxy layer 100 includes the first type semiconductor layer 101, the second type semiconductor layer 102, and the active layer 103. The active layer 103 is disposed between the first type semiconductor layer 101 and the second type semiconductor layer 102. The first pad 111 and the second pad 112 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111. The second ohmic contact metal 122 is disposed between the second type semiconductor layer 102 and the second pad 112. The first etch protection conductive layer 531 is disposed between the first ohmic contact metal 121 and the first pad 111.

A micro LED 5 of the embodiment differs from the micro LED 1 of the first embodiment in that a top surface 531T of a first etch protection conductive layer 531 is lower than the top surface 140T of the dielectric layer 140. Accordingly, when subsequently being disposed on the first etch protection conductive layer 531, the first pad 111 is filled into a gap provided between the top surface 531T of the first etch protection conductive layer 531 and the dielectric layer 140, and the yield may be further increased.

Except for the description about the width of the orthogonal projection of the first etch protection conductive layer 531 on the first type semiconductor layer 101, reference is made to the first embodiment for other details about the micro LED 5, and the same details will not be repeated in the following.

Figure 6:
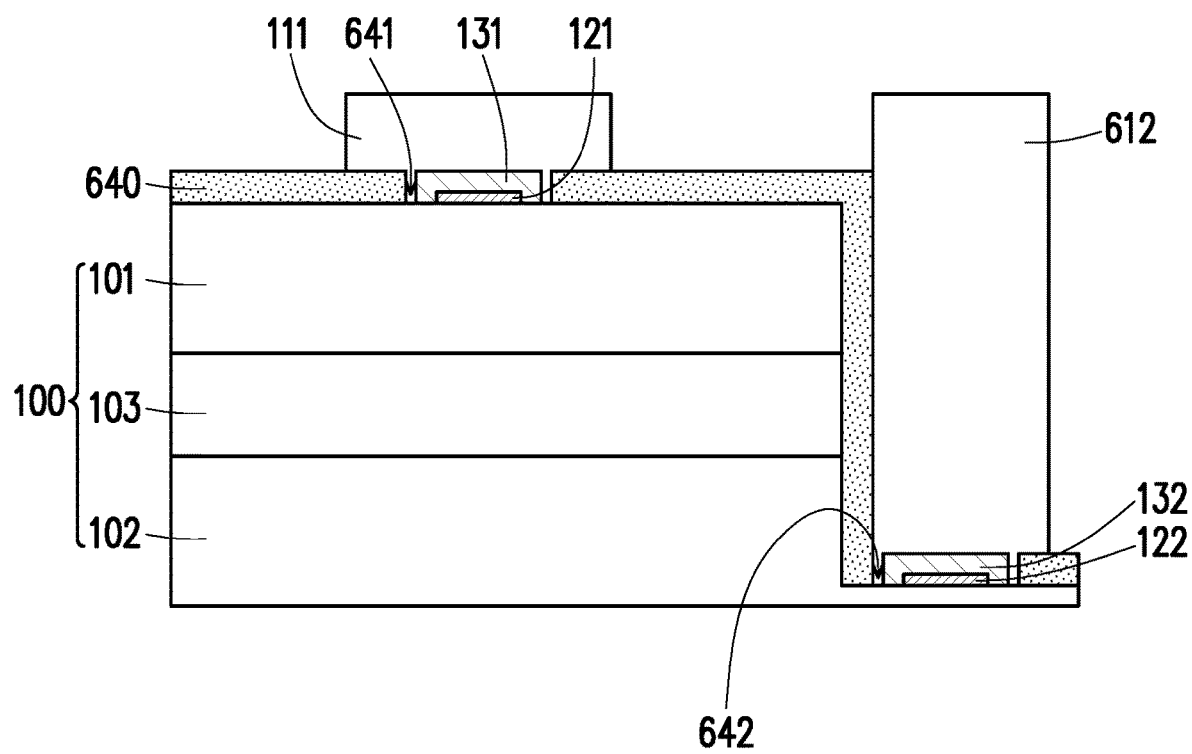

Referring to FIG. 6, FIG. 6 illustrates a micro LED according to a sixth embodiment of the disclosure. A micro LED 6 includes the epitaxy layer 100, the first pad 111, the second pad 612, the first ohmic contact metal 121, the second ohmic contact metal 122, the first etch protection conductive layer 131, the second etch protection conductive layer 132, and the dielectric layer 640. The epitaxy layer 100 includes the first type semiconductor layer 101, the second type semiconductor layer 102, and the active layer 103. The active layer 103 is disposed between the first type semiconductor layer 101 and the second type semiconductor layer 102. The first pad 111 and the second pad 612 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111. The second ohmic contact metal 122 is disposed between the second type semiconductor layer 102 and the second pad 612. The first etch protection conductive layer 131 is disposed between the first ohmic contact metal 121 and the first pad 111. The second etch protection conductive layer 132 is disposed between the second ohmic contact metal 122 and the second pad 612. In addition, the first ohmic contact metal 121 and the first etch protection conductive layer 131 are disposed in the first through hole 641 of the dielectric layer 640, and the second ohmic contact metal 122 and the second etch protection conductive layer 132 are disposed in the second through hole 642 of the dielectric layer 640.

The micro LED 6 of the embodiment differs from the micro LED 3 of the third embodiment in that, in the micro LED 3, the second pad 112 is disposed in the opening 105, whereas in the micro LED 6, a second pad 612 is disposed on a side of the epitaxy layer 100. By making the first pad 111 and the second pad 612 equal in height, the transfer and bonding yield of the micro LED 6 may be further increased.

Except for the description about the position where the second pad 612 is disposed, reference is made to the third embodiment for other details about the micro LED 6, and the same details will not be repeated in the following.

Figure 7:
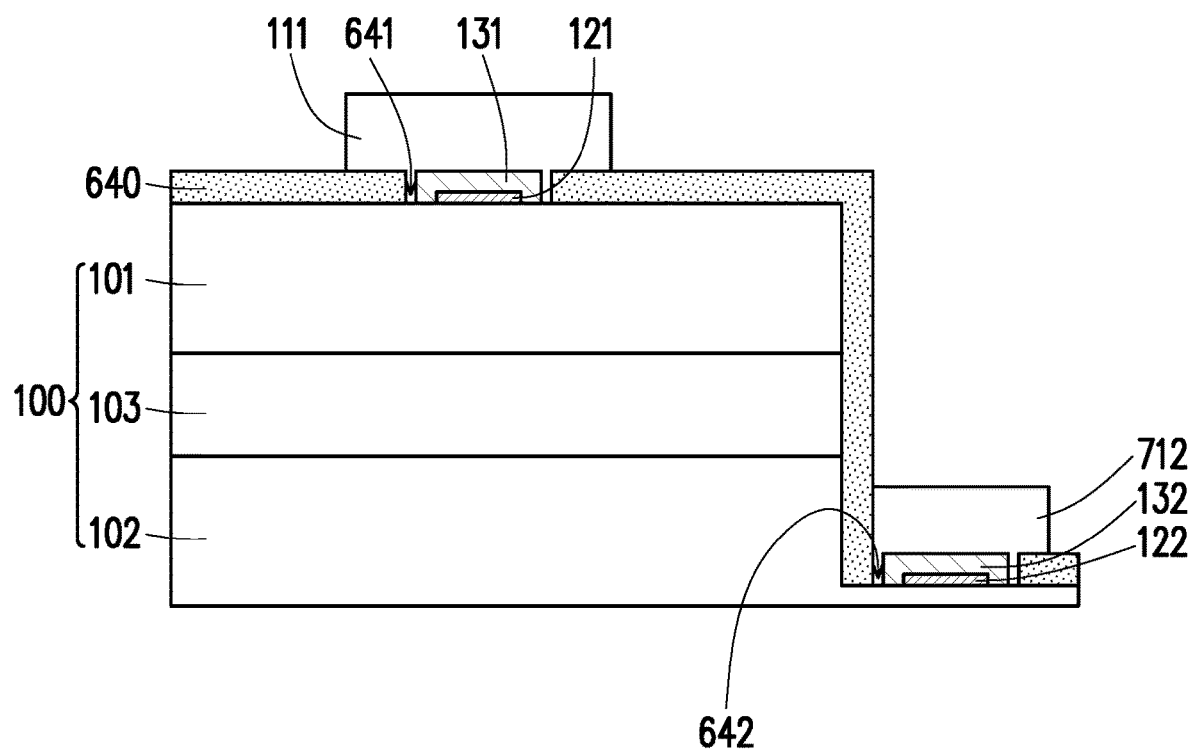

Referring to FIG. 7, FIG. 7 illustrates a micro LED according to a seventh embodiment of the disclosure. A micro LED 7 includes the epitaxy layer 100, the first pad 111, the second pad 712, the first ohmic contact metal 121, the second ohmic contact metal 122, the first etch protection conductive layer 131, the second etch protection conductive layer 132, and the dielectric layer 640. The epitaxy layer 100 includes the first type semiconductor layer 101, the second type semiconductor layer 102, and the active layer 103. The active layer 103 is disposed between the first type semiconductor layer 101 and the second type semiconductor layer 102. The first pad 111 and the second pad 712 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111. The second ohmic contact metal 122 is disposed between the second type semiconductor layer 102 and the second pad 712. The first etch protection conductive layer 131 is disposed between the first ohmic contact metal 121 and the first pad 111. The second etch protection conductive layer 132 is disposed between the second ohmic contact metal 122 and the second pad 712. In addition, the first ohmic contact metal 121 and the first etch protection conductive layer 131 are disposed in the first through hole 641 of the dielectric layer 640, and the second ohmic contact metal 122 and the second etch protection conductive layer 132 are disposed in the second through hole 642 of the dielectric layer 640.

The micro LED 7 of the embodiment differs from the micro LED 3 of the third embodiment in that the second pad 112 of the micro LED 3 is disposed in the opening 105, whereas a second pad 712 of the micro LED 7 is disposed on a side of the second type semiconductor layer 102, which can achieve better yield for a wire bonding process.

Except for the description about the position where the second pad 712 is disposed, reference is made to the third embodiment for other details about the micro LED 7, and the same details will not be repeated in the following.

Figure 8:
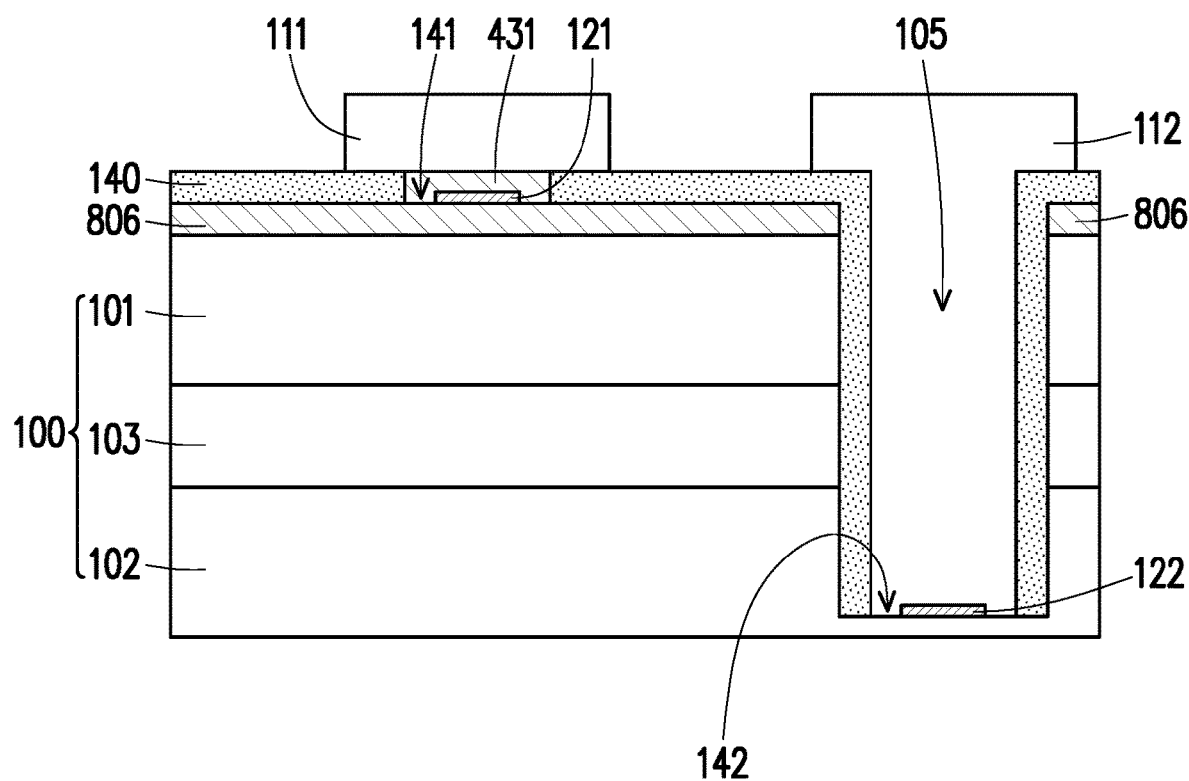

Referring to FIG. 8, FIG. 8 illustrates a micro LED according to an eighth embodiment of the disclosure. A micro LED 8 includes the epitaxy layer 100, the first pad 111, the second pad 112, the first ohmic contact metal 121, the second ohmic contact metal 122, the first etch protection conductive layer 431, a current distribution layer 806, and the dielectric layer 140. The epitaxy layer 100 includes the first type semiconductor layer 101, the second type semiconductor layer 102, and the active layer 103. The active layer 103 is disposed between the first type semiconductor layer 101 and the second type semiconductor layer 102. The first pad 111 and the second pad 112 serve as metal electrodes of the epitaxy layer 100, and are respectively electrically connected to the first type semiconductor layer 101 and the second type semiconductor layer 102. The first ohmic contact metal 121 is disposed between the first type semiconductor layer 101 and the first pad 111. The second ohmic contact metal 122 is disposed between the second type semiconductor layer 102 and the second pad 112. The first etch protection conductive layer 431 is disposed between the first ohmic contact metal 121 and the first pad 111.

Compared with the micro LED 4 shown in the fourth embodiment, the micro LED 8 of the embodiment is further provided with the current distribution layer 806. The current distribution layer 806 may be, for example, a transparent conductive layer. By disposing the current distribution layer 806, the light emitting region of the epitaxy layer 100 is increased, and the internal quantum efficiency of the micro LED 8 is enhanced. In an embodiment of the disclosure, the current distribution layer 806 and the first etch protection conductive layer 431 include the same material, so as to facilitate current transmission.

Except for the description about the current distribution layer 806, reference is made to the fourth embodiment for other details about the micro LED 8, and the same details will not be repeated in the following.

Figure 9:
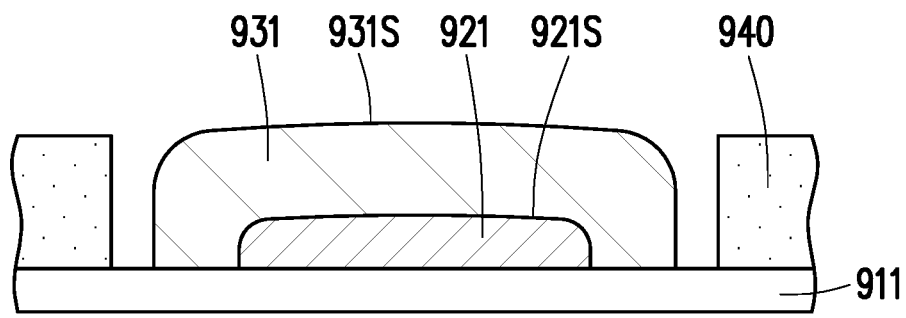
FIG. 9 illustrates a partial structure of a micro LED according to a ninth embodiment of the disclosure.

Referring to FIG. 9, FIG. 9 illustrates a partial structure of a micro LED according to a ninth embodiment of the disclosure. The micro LED of the ninth embodiment includes a first type semiconductor layer 911, an ohmic contact metal 921, an etch protection conductive layer 931, and a dielectric layer 940. Compared with the foregoing embodiments, the ohmic contact metal 921 has a surface 921S, and the surface 921S is a curved surface. The etch protection conductive layer 931 also has a surface 931S, and the surface 931S is a curved surface. Specifically, since the surface 921S of the ohmic contact metal 921 is a curved surface, such a structure may increase the area in which the etch protection conductive layer 931 formed on the ohmic contact metal 921 covers the surface 921S of the ohmic contact metal 921, and the angle change of the surface 921S is alleviated so the manufacturing yield is increased.

Except for the description about the shapes of the ohmic contact metal 921 and the etch protection conductive layer 931, the structure of other parts of the micro LED of the ninth embodiment may be the same as or similar to the structures of the micro LEDs of the first to eighth embodiments.

The ohmic contact metal 921 may be considered as an example of the first ohmic contact metal 121 and the second ohmic contact metal 122 of the aforementioned embodiments. The etch protection conductive layer 921 may be considered as an example of the first etch protection conductive layer 131, the first etch protection conductive layer 431, the first etch protection conductive layer 531, and the second etch protection conductive layer 132 of the aforementioned embodiments.

Figure 10:
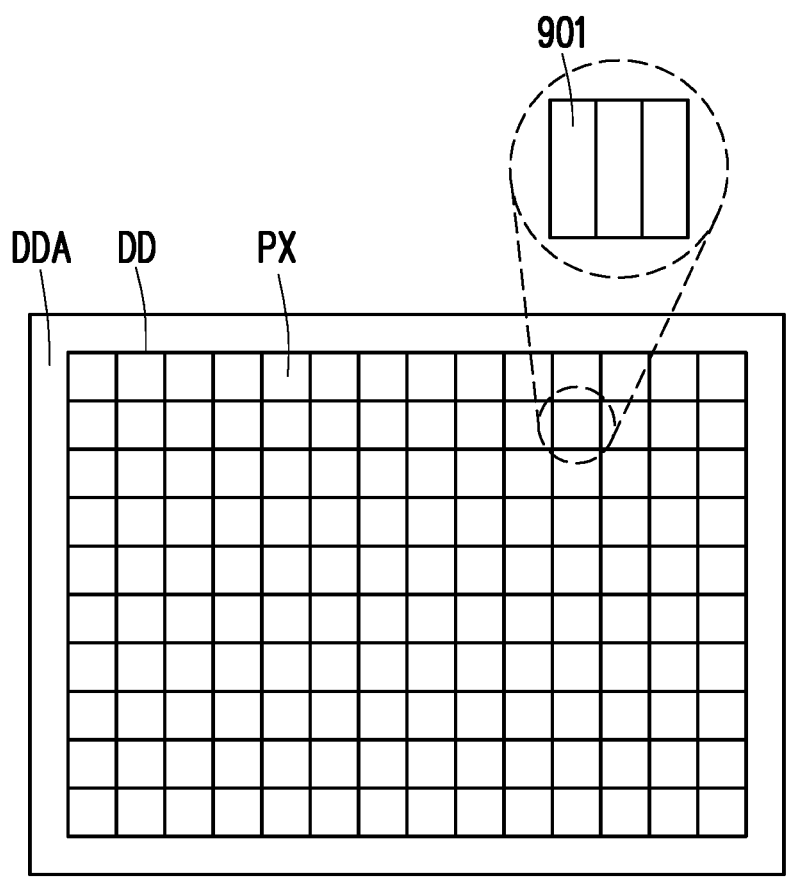
FIG. 10 illustrates a display panel according to an embodiment of the disclosure.

Referring to FIG. 10, FIG. 10 illustrates a display panel according to an embodiment of the disclosure. The display panel 9 includes a display region DD and a non-display region DDA. The display region DD includes a plurality of pixel units PX arranged in an array. Each of the pixel units PX includes at least one micro LED 901. The micro LED 901 may be implemented according to any one of the micro LEDs of the first to ninth embodiments.

In view of the foregoing, the micro LED according to the embodiments of the disclosure is provided with the etch protection conductive layer disposed between the pixel electrode and the ohmic contact metal. Since the etch protection conductive layer serves as the etching-protective layer of the ohmic contact metal, the electrode of the micro LED is not damaged during the manufacturing process to reduce the contact resistance. Therefore, the light emitting efficiency is high. In addition, the display panel according to the embodiments of the disclosure includes the micro LED having a low contact resistance and high light emitting efficiency.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A micro light emitting diode (micro LED), comprising:
 an epitaxy layer, comprising:
  a first type semiconductor layer;
  a second type semiconductor layer; and
  an active layer, disposed between the first type semiconductor layer and the second type semiconductor layer;
 a first pad, electrically connected to the first type semiconductor layer;
 a second pad, electrically connected to the second type semiconductor layer;
 a first ohmic contact metal, disposed between the first type semiconductor layer and the first pad;
 a second ohmic contact metal, disposed between the second type semiconductor layer and the second pad;

at least one etch protection conductive layer, disposed between the first ohmic contact metal and the first pad; and a dielectric layer, wherein the dielectric layer, the first pad, and the second pad are disposed on a same side of the epitaxy layer, and the first ohmic contact metal and the second ohmic contact metal are respectively disposed in a first through hole and a second through hole of the dielectric layer, wherein the at least one etch protection conductive layer directly contacts and encapsulates an exposed surface of the first ohmic contact metal, and a ratio of an orthogonal projection area of the at least one etch protection conductive layer on the first type semiconductor layer to an orthogonal projection area of the first ohmic contact metal on the first type semiconductor layer ranges from 1.0 to 1.2, except 1.0, wherein the at least one etch protection conductive layer is disposed between the first ohmic contact metal and the first pad and disposed in the first through hole, the orthogonal projection area of the at least one etch protection conductive layer on the first type semiconductor layer is smaller than an orthogonal projection area of the first through hole on the first type semiconductor layer, and the at least one etch protection conductive layer directly contacts a side surface of the first ohmic contact metal, wherein the at least one etch protection conductive layer includes ITO.

2. The micro LED as claimed in claim 1, wherein the at least one etch protection conductive layer is disposed between the first ohmic contact metal and the first pad, and a top surface of the at least one etch protection conductive layer away from the first type semiconductor layer is aligned to a top surface of the dielectric layer away from the first type semiconductor layer.

3. The micro LED as claimed in claim 1, further comprising a current distribution layer disposed between the dielectric layer and the first type semiconductor layer.

4. The micro LED as claimed in claim 1, wherein a resistivity of the at least one etch protection conductive layer is greater than or equal to a resistivity of any one of the first pad, the second pad, the first ohmic contact metal, and the second ohmic contact metal.

5. The micro LED as claimed in claim 1, wherein the at least one etch protection conductive layer is disposed between the second ohmic contact metal and the second pad and disposed in the second through hole, and an orthogonal projection area of the at least one etch protection conductive layer on the second type semiconductor layer is smaller than or equal to an orthogonal projection area of the second through hole on the second type semiconductor layer.

6. The micro LED as claimed in claim 1, wherein the at least one etch protection conductive layer is disposed between the second ohmic contact metal and the second pad, a minimum interval is provided between the at least one etch protection conductive layer and the epitaxy layer, and the minimum interval is greater than or equal to 300 nm.

7. The micro LED as claimed in claim 6, wherein the micro LED meets a condition $D_{C1}<D_{ESL1}\leq 5\times D_{C1}$ or $D_{C2}<D_{ESL2}\leq 5\times D_{C2}$, wherein $D_{ESL1}$ represents a thickness of the etch protection conductive layer disposed between the first ohmic contact metal and the first pad in a normal direction of the first type semiconductor layer, $D_{ESL2}$ represents a thickness of the etch protection conductive layer disposed between the second ohmic contact metal and the second pad in the normal direction of the first type semiconductor layer, $D_{C1}$ represents a thickness of the first ohmic contact metal in the normal direction of the first type semiconductor layer, and $D_{C2}$ represents a thickness of the second ohmic contact metal in the normal direction of the first type semiconductor layer.

8. The micro LED as claimed in claim 7, wherein a ratio of $D_{ESL1}/D_{ESL2}$ ranges from 0.9 to 1.1.

9. The micro LED as claimed in claim 1, wherein the at least one etch protection conductive layer is disposed between the first ohmic contact metal and the first pad, the first ohmic contact metal has a surface, the surface is located between the first ohmic contact metal and the at least one etch protection conductive layer, and the surface is a curved surface.

10. The micro LED as claimed in claim 1, wherein the at least one etch protection conductive layer is disposed between the second ohmic contact metal and the second pad, the second ohmic contact metal has a surface, the surface is located between the second ohmic contact metal and the at least one etch protection conductive layer, and the surface is a curved surface.

11. The micro LED as claimed in claim 1, wherein a resistivity of the at least one etch protection conductive layer is less than $5\times 10^{-4}$ Ω·cm.

12. A display panel, comprising a plurality of pixel units arranged in an array, wherein each of the pixel units comprises the micro LED as claimed in claim 1.

* * * * *